United States Patent
Pan et al.

(10) Patent No.: US 10,205,275 B2
(45) Date of Patent: Feb. 12, 2019

(54) PLUG DEVICE AND METHOD OF AUTOMATICALLY PLUGGING DISPLAY PANEL WITH CONNECTOR

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Deng Pan, Beijing (CN); Fangqing Li, Beijing (CN); Wei Dai, Beijing (CN); Weiwei Wang, Beijing (CN); Wenhua Fu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 180 days.

(21) Appl. No.: 15/088,358

(22) Filed: Apr. 1, 2016

(65) Prior Publication Data

US 2017/0047678 A1 Feb. 16, 2017

(30) Foreign Application Priority Data

Aug. 14, 2015 (CN) .......................... 2015 1 0501550

(51) Int. Cl.
*H01R 13/629* (2006.01)
*G01R 31/28* (2006.01)
(Continued)

(52) U.S. Cl.
CPC ......... *H01R 13/629* (2013.01); *G01R 31/282* (2013.01); *G09G 3/006* (2013.01);
(Continued)

(58) Field of Classification Search
CPC .... G01R 31/282; G09G 3/006; H01R 13/629; H01R 13/62933
(Continued)

(56) References Cited

U.S. PATENT DOCUMENTS 3,818,325 A * 6/1974 Boshers ............. G01R 31/3658
324/434
4,334,193 A * 6/1982 Gordy ................ G01R 31/3658
324/426
(Continued)

FOREIGN PATENT DOCUMENTS

| CN | 1629650 A | 6/2005 |
| CN | 201478664 U | 5/2010 |

(Continued)

OTHER PUBLICATIONS

First Office Action dated Dec. 30, 2016 in corresponding Chinese Application No. 201510501550.6.

*Primary Examiner* — Felix O Figueroa
(74) *Attorney, Agent, or Firm* — Nath, Goldberg & Meyer; Joshua B. Goldberg

(57) ABSTRACT

A plug device for automatically plugging a display panel and a connector comprises a first linkage having a fixed end and a movable end that can approach or get away from the display panel at a plug location. The connector comprises a first connector head, a second connector head and a wire that connects the first and second connector heads, the connector is mounted on the first linkage, the first and second connector heads of the connector are respectively secured on the movable end and the fixed end of the first linkage. The second connector head is connected with a signal generator, and when the movable end approaches the display panel at the plug location, the first connector head is automatically plugged on the display panel. The plug device may be used (Continued)

in a method of automatically plugging a display panel with a connector.

20 Claims, 3 Drawing Sheets

(51) Int. Cl.
*G09G 3/00* (2006.01)
*H01R 43/26* (2006.01)

(52) U.S. Cl.
CPC ....... *H01R 13/62933* (2013.01); *H01R 43/26* (2013.01); *H01R 2201/20* (2013.01)

(58) Field of Classification Search
USPC .............................................. 324/756.05, 538
See application file for complete search history.

(56) References Cited

U.S. PATENT DOCUMENTS

| | | | | |
|---|---|---|---|---|
| 6,791,843 B1 * | 9/2004 | Dobbs | ............. | H01R 13/62933 361/740 |
| 6,967,497 B1 * | 11/2005 | Hembree | .......... | H01L 21/67248 324/750.02 |
| 7,463,042 B2 * | 12/2008 | Pereira | ................. | G01R 31/045 324/538 |
| 8,647,144 B2 * | 2/2014 | Wakao | ............. | H01R 13/62933 439/157 |

FOREIGN PATENT DOCUMENTS

| | | |
|---|---|---|
| CN | 101944701 A | 1/2011 |
| CN | 101958093 A | 1/2011 |
| CN | 201916340 | 8/2011 |
| CN | 204323370 U | 5/2015 |
| EP | 1713239 A1 | 10/2006 |

* cited by examiner

PLUG DEVICE AND METHOD OF AUTOMATICALLY PLUGGING DISPLAY PANEL WITH CONNECTOR

FIELD OF THE INVENTION

The disclosure relates to a plug device, and particularly relates to a plug device that automatically plugs a connector with a display panel during Aging Test, and a method of automatically plugging a display panel with a connector.

BACKGROUND OF THE INVENTION

In the preparation techniques of display panels, the prepared display panel needs to go through Aging Test to test its life span and reliability. Aging Test is a kind of lighting test which refers to tests conducted at a state where the display panel is displaying. It is to be understood that during Aging Test, an external light source is needed to provide light rays for the display panel, while a drive signal is also needed to be provided for the display panel to display.

In the prior art, the signal generator is connected with the display panel via a connector, so as to provide drive signals for the display panel. Specifically, the connector comprises a first connector head, a second connector head and a wire that connects the two connector heads, wherein the first connector head keeps in plug with the signal generator and the second connector head is used to be plugged with the display panel. Specifically, during Aging Test, a tester needs to manually plug the second connector head with the display panel after the display panel on an assembly line is transmitted to a plug location, so that the signal generator can provide drive signals for the display panel.

The above prior art has the following problems in practice:

Firstly, the connection between the display panel and the connector is realized by being manually plugged by testers, thus a great number of testers are desired along the assembly line of display panels. Meanwhile, testers bear great labour intensity during operation.

Secondly, during the process of plugging the display panel with the connector, plug speed and accuracy are relatively low due to limitations in testers' experience, unavoidable plugging errors during the process of manual plug and the like.

SUMMARY OF THE INVENTION

The disclosure has been accomplished in order to solve the above problems and it is an object thereof to provide a plug device and a method of automatically plugging a display panel with a connector that realize the following advantages: realizing automatic plug of a connector with a display panel, thereby completing plug without manual operation, which may, compared with the prior art, reduce the number of testers on the assembly line as well as their labour intensity, and improve plug speed and accuracy.

According to a first aspect of the disclosure, there is provided a plug device for automatically plugging a display panel with a connector comprising:

a first linkage having a fixed end and a movable end that can approach or get away from the display panel at a plug location, wherein the connector comprises a first connector head, a second connector head and a wire that connects the first and second connector heads, the connector is mounted on the first linkage, the first and second connector heads of the connector are respectively secured on the movable end and the fixed end of the first linkage; and wherein the second connector head is connected with a signal generator, when the movable end approaches the display panel at the plug location, the first connector head is automatically plugged on the display panel.

According to a second aspect of the disclosure, there is provided the plug device according to the first aspect, further comprising a fixed part and a second linkage, wherein the fixed end of the first linkage is hinged on the fixed part, so that the first linkage can rotate relative to the fixed part with the fixed end thereof as a rotational shaft; and wherein both ends of the second linkage are respectively hinged with the fixed part and the first linkage, a hinge shaft between the second linkage and the first linkage is positioned within a sliding groove under the first linkage.

According to a third aspect of the disclosure, there is provided the plug device according to the first aspect, further comprising a drive mechanism, wherein the drive mechanism is used to drive the movable end of the first linkage so that the movable end approaches or gets away from the display panel at the plug location.

According to a fourth aspect of the disclosure, there is provided the plug device according to the second aspect, further comprising a drive mechanism, wherein the drive mechanism is used to drive the movable end of the first linkage so that the movable end approaches or gets away from the display panel at the plug location.

According to a fifth aspect of the disclosure, there is provided the plug device according to the first aspect, wherein the connection between the first connector head and the wire is a movable plug and the connection between the second connector head and the wire is a fixed connection.

According to a sixth aspect of the disclosure, there is provided the plug device according to the fifth aspect, wherein an end of the wire which is connected with the first connector head is an ox horn socket structure.

According to a seventh aspect of the disclosure, there is provided the plug device according to the first aspect, wherein a length of pins of the first connector head to be plugged with the display panel is greater than a length of pins of the second connector head to be connected with the signal generator.

According to an eighth aspect of the disclosure, there is provided the plug device according to the seventh aspect, wherein the length of pins of the first connector head to be plugged with the display panel is 30-40 mm.

According to a ninth aspect of the disclosure, there is provided the plug device according to the first aspect, wherein an end of the wire which is connected with the first connector head is a hard material.

According to a tenth aspect of the disclosure, there is provided the plug device according to the eighth aspect, wherein an end of the wire which is connected with the first connector head is a hard material.

According to an eleventh aspect of the disclosure, there is provided the plug device according to the first aspect, further comprising a fixed mechanism, wherein the fixed mechanism fixes the display panel at the plug location.

According to a twelfth aspect of the disclosure, there is provided the plug device according to the first aspect, further comprising a testing mechanism, wherein the testing mechanism tests a location where the display panel is located.

According to a thirteenth aspect of the disclosure, there is provided the plug device according to the eleventh aspect, further comprising a testing mechanism, wherein the testing mechanism tests a location where the display panel is located.

According to a fourteenth aspect of the disclosure, there is provided the plug device according to the first aspect, further comprising a plug interface sensing mechanism, wherein the plug interface sensing mechanism is mounted on the movable end of the first linkage for sensing the plug interface of the display panel plugged with the first connector head, as well as a depth of the first connector head plugging into the plug interface.

According to a fifteenth aspect of the disclosure, there is provided the plug device according to the twelfth aspect, further comprising a plug interface sensing mechanism, wherein the plug interface sensing mechanism is mounted on the movable end of the first linkage for sensing the plug interface of the display panel plugged with the first connector head, as well as a depth of the first connector head plugging into the plug interface.

According to a sixteenth aspect of the disclosure, there is provided the plug device according to the thirteenth aspect, further comprising a plug interface sensing mechanism, wherein the plug interface sensing mechanism is mounted on the movable end of the first linkage for sensing the plug interface of the display panel plugged with the first connector head, as well as a depth of the first connector head plugging into the plug interface.

According to a seventeenth aspect of the disclosure, there is provided a method of utilizing the plug device according to the first aspect to automatically plug a display panel with a connector comprising:

moving the display panel to a plug location; and approaching a movable end of a first linkage toward the display panel so that the connector on the first linkage is automatically plugged with the display panel.

According to an eighteenth aspect of the disclosure, there is provided the method according to the seventeenth aspect, wherein after moving the display panel to the plug location, fixing the display panel at the plug location with a fixed mechanism.

According to a nineteenth aspect of the disclosure, there is provided the method according to the seventeenth aspect, wherein after moving the display panel, testing whether the display panel is at the plug location with a testing mechanism.

According to a twentieth aspect of the disclosure, there is provided the method according to the seventeenth aspect, wherein when the movable end of the first linkage approaches the display panel, using a plug interface sensing mechanism to sense a plug interface of the display panel to be plugged with the first connector head, so that the first connector head of the connector is aligned with the plug interface of the display panel, and a depth of the first connector head plugging into the plug interface.

In the plug device according to the first aspect and the method according to the seventeenth aspect, automatic plug between a connector and a display panel is realized, thereby realizing plug without manual operation, which may, compared with the prior art, reduce the number of testers on the assembly line and their labour intensity, and improve plug speed and accuracy.

In the plug device according to the second aspect, it may prevent a connection between the first connector head and a plug interface of the display panel from being damaged due to excessive movement of the first linkage.

In the plug device according to the third and fourth aspects, it may realize automatic plug of the connector and the display panel and implement feedback control of a control unit.

In the plug device according to the fifth and sixth aspects, it may improve applicability of the plug device.

In the plug device according to the seventh to thirteenth aspects and the method according to the eighteenth to nineteenth aspects, it may improve accuracy of automatic plug between the connector and the display panel.

In the plug device according to the fourteenth to sixteenth aspects and the method according to the twentieth aspect, it may improve accuracy of automatic plug between the connector and the display panel, and prevent a connection between the first connector head and a plug interface of the display panel from being damaged due to excessive movement of the first linkage.

BRIEF DESCRIPTION OF THE DRAWINGS

Accompanying drawings are provided for further understanding of this disclosure and constituting a part of the specification. Hereinafter, these drawings are intended to explain the disclosure together with the following specific embodiments, but should not be considered as a limitation of the disclosure. In which.

REFERENCE SIGNS

1: first linkage; 2: connector; 3: signal generator; 4: fixed part; 5: second linkage; 10: fixed end; 11: movable end; 12: sliding groove; 20: first connector head; 21: second connector head; 22: wire; 221: ox horn socket structure; 30: drive mechanism; 40: fixed mechanism; 50: testing mechanism; 60: plug interface sensing mechanism.

DETAILED DESCRIPTION OF THE EMBODIMENTS

Hereinafter, specific embodiments of the disclosure will be described in detail in conjunction with the accompanying drawings. It should be understood that the specific embodiments as set forth herein are merely for the purpose of illustration and explanation of the disclosure and should not be constructed as a limitation thereof.

According one aspect of the disclosure, there is provided a plug device, especially a plug device for automatically plugging a display panel with a connector.

Figure 1:
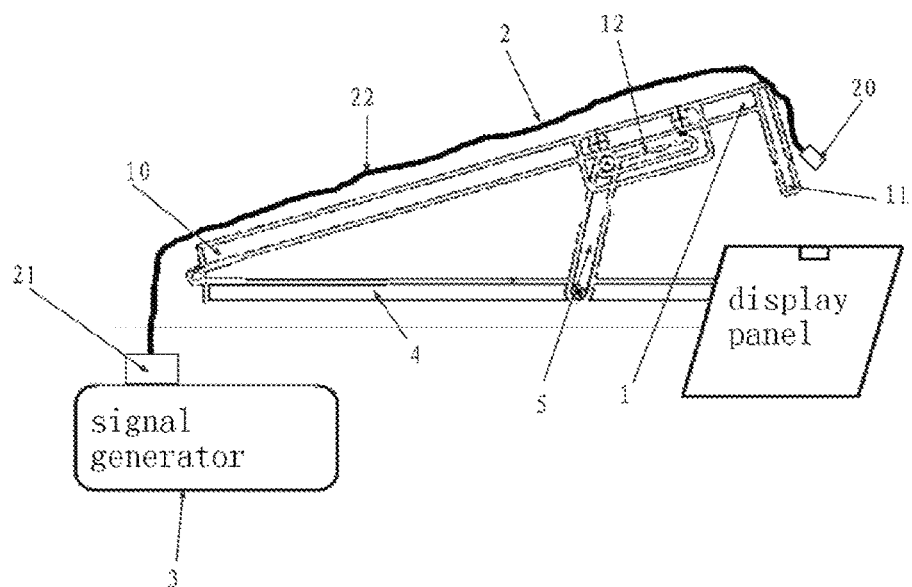
FIG. 1 is a schematic view showing a plug device in which a connector is in an unfixed state according to the exemplary embodiment of the disclosure.
Figure 3:
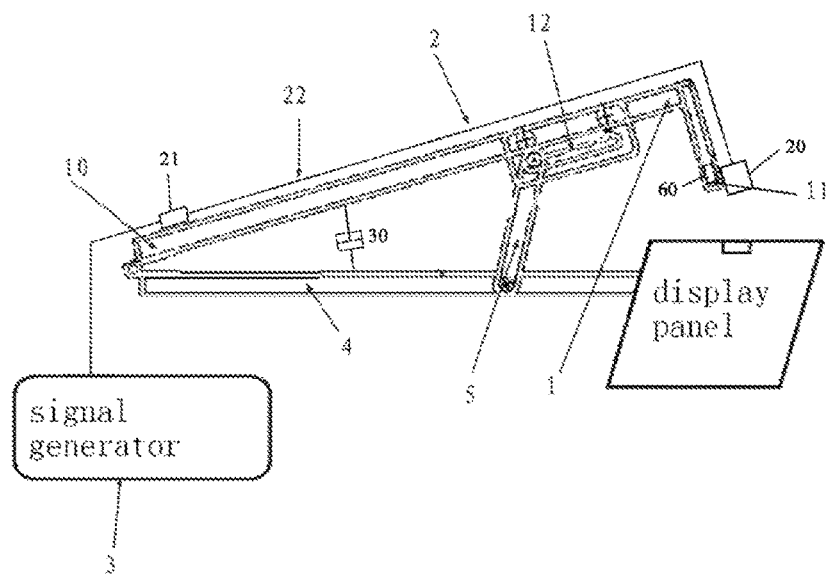
FIG. 3 is another schematic view showing the plug device in which a connector is in a fixed state according to the exemplary embodiment of the disclosure.

FIG. 1 is a schematic view showing a plug device in which a connector is in an unfixed state according to the exemplary embodiment of the disclosure; and FIG. 3 is another schematic view showing the plug device in which a connector is in a fixed state according to the exemplary embodiment of the disclosure. As shown in FIGS. 1 and 3, in this embodiment, the plug device comprises a first linkage 1 having a fixed end 10 and a movable end 11 that can approach or get away from the display panel at a plug location, wherein a connector 2 comprises a first connector head 20, a second connector head 21 and a wire 22 that connects the first and second connector heads, the connector 2 is mounted on the first linkage 1 and the first connector head 20 and the second connector head 21 of the connector 2 are respectively secured on the movable end 11 and the fixed end 10 of the first linkage 1; and wherein the second connector head 21 is connected with a signal generator 3, when the movable end 11 approaches the display panel at the plug location, the first connector head 20 is automatically plugged on the display panel.

The connector 2 being mounted on the first linkage 1 means that the first connector head 20 thereof is fixed on the movable end 11 of the first linkage 1, i.e., the position and direction of the first connector head 20 are fixed relative to the first linkage 1, and the second connector head 21 thereof is fixed on the fixed end 10 of the first linkage 1, i.e., the position and direction of the second connector head 21 are fixed relative to the first linkage 1. However, the wire between the first connector head 20 and the second connector head 21 may be fixed on the first linkage 1 in various manners, such as bonding, snapping, and the like.

In this embodiment, when the movable end 11 of the first linkage 1 approaches toward the display panel at the plug location, the first connector head 20 of the connector 2 fixed on the movable end 11 also approaches toward the display panel at the plug location, and during this process, the first connector head 20 contacts a corresponding part (the pins of the display panel that are connected with the connector) of the display panel and is plugged with pins on the display panel, thereby realizing automatic plug of the display panel with the connector 2. Meanwhile, the second connector head 21 of the connector 2 is connected with the signal generator 3, thereby realizing connection of the signal generator 3 and the display panel. Therefore, the signal generator 3 may provide drive signals for the display panel to make the display panel display and further create circumstances desired by the lighting test.

As discussed above, during Aging Test (and other tests) of the display panel, when a drive signal is required to be provided for the display panel, a tester only needs to approach the movable end 11 of the first linkage 1 toward the display panel at the plug location, instead of manually plugging the connector 2 with the display panel, to realize plug of the display panel with the connector 2. Compared with manual plug of the prior art, automatic plug may reduce the number of testers desired on the assembly line as well as their labour intensity. Meanwhile, on the other hand, compared with manual plug, automatic plug has higher plug speed and accuracy, thus may improve testing efficiency and accuracy.

Specifically, as shown in FIGS. 1 and 3, the plug device further comprises a fixed part 4 and a second linkage 5; the fixed end 10 of the first linkage 1 is hinged on the fixed part 4 so that the first linkage 1 may rotate relative to the fixed part 4 with the fixed end 10 thereof as a rotational shaft; and wherein both ends of the second linkage 5 are respectively hinged with the fixed part 4 and the first linkage 1, a hinge shaft between the second linkage 5 and the first linkage 1 is positioned within a sliding groove 12 under the first linkage 1. The hinge shaft is slidable within the sliding groove 12. Alternatively, the sliding groove 12 is provided with a limit sensing member (not shown) therein at the right side of the hinge shaft. The position of the limit sensing member within the sliding groove may be adjusted according to actual requirements, so as to limit a movement limit position of the hinge shaft within the sliding groove, thereby physically preventing the first linkage 1 from moving excessively along a clockwise direction, and further preventing a connection between the first connector head 20 and a plug interface of the display panel from being damaged due to the excessive movement of the first linkage 1. In addition, the limit sensing member may be a member that can limit movement of the hinge shaft and feedback related signals to a drive mechanism or control unit, such as a pressure sensing member, piezoelectric sensing member, and the like.

Preferably, as shown in FIG. 3, the plug device comprises a drive mechanism 30 for driving the movable end 11 of the first linkage 1 to approach or get away from the display panel at the plug location. Such design may, after the display panel is transmitted to the plug location, realize automatic plug of the display panel with the connector 2 without manual operation of the tester, thereby realizing full-process automatic plug between the display panel and the connector 2. Of course, after the display panel is transmitted to the plug location, the plug between the display panel and the connector 2 may also be realized through manually driving the movable end 11 of the first linkage 1 to move by a tester.

Preferably, the connection between the first connector head 20 and the wire 22 is a movable plug and the connection between the second connector head 21 and the wire 22 is a fixed connection. Such design enables changing first connector heads 20 of different sizes to adapt pins of different-sized display panels to be connected with the connector, so that the connector 2 may be connected with different display panels, and thus conduct Aging Test (or other tests) on different-sized display panels. Compared with the prior art, in this embodiment, in the case of being connected with different-sized display panels, it only needs to change the first connector head 20 instead of the wire 22 and second connector head 21, thereby improving applicability of the plug device of the disclosure.

Figure 4:
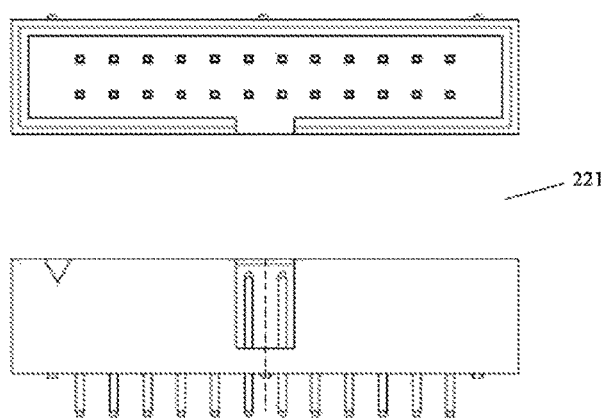
FIG. 4 is a schematic view showing an ox horn socket structure according to the exemplary embodiment of the disclosure.

Further, an end of the wire 22 which is connected with the first connector head 20 is an ox horn socket structure 221 which is shown in FIG. 4. It is to be understood that in terms of different-sized display panels, the pins thereof connected with the connector 2 are different, and such difference may be demonstrated in inputting different signals to the display panel from pins at the same position. However, the ox horn socket structure 221 of said wire may adjust the signal type input by the wire 22 to each pin of the first connector heads 20 when changing different first connector heads 20, so that when different first connector heads 20 are connected with the wire 22, signals provided by each pin of the first connector heads 20 are input signals desired by corresponding pins on the display panel. The ox horn socket structure 221 of the wire improves applicability of the plug device of the disclosure.

Figure 2:
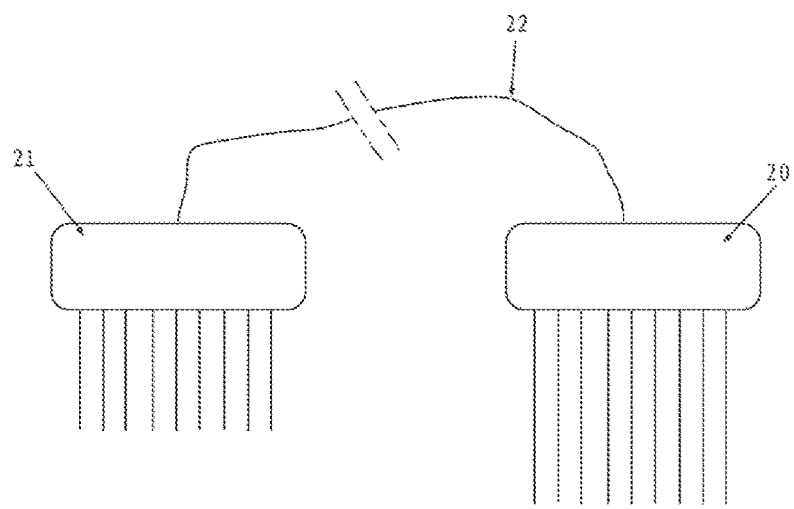
FIG. 2 is a schematic view showing the first and second connector heads.

Preferably, as shown in FIG. 2, a length of pins of the first connector head 20 to be plugged with the display panel is greater than a length of pins of the second connector head 21 to be connected with the signal generator 3. In the embodiment, the second connector head 21 keeps in connection with the signal generator 3 throughout the Aging Test and does not need to be plugged in and out frequently. Therefore, the second connector head 21 may be connected to the signal generator 3 in a manual plug manner without additional apparatus for automatic plug. It is to be understood that during manual plug, the pin length of the second connector head 21 may be smaller; while during automatic plug, especially when the plug device for automatic plug has a structure as shown in FIG. 3 (i.e., the movable end 11 of the first linkage 1 rotatably approaches or gets away from the display panel at the plug location), in a certain scope, the larger the pin length of the first connector head 20 is, the higher the accuracy of automatic plug will be. Therefore, the above design may improve the accuracy of automatic plug. Specifically, the length of pins of first connector head 20 to be plugged with the display panel may be 30-40 mm.

Further, an end of the wire which is connected with the first connector head 20 is a hard material. Such design contributes to improving stability of the first connector head 20, so as to prevent the first connector head 20 from shaking during movement of the movable end 11 of the first linkage 1 and further influencing accuracy of automatic plug.

Figure 5:
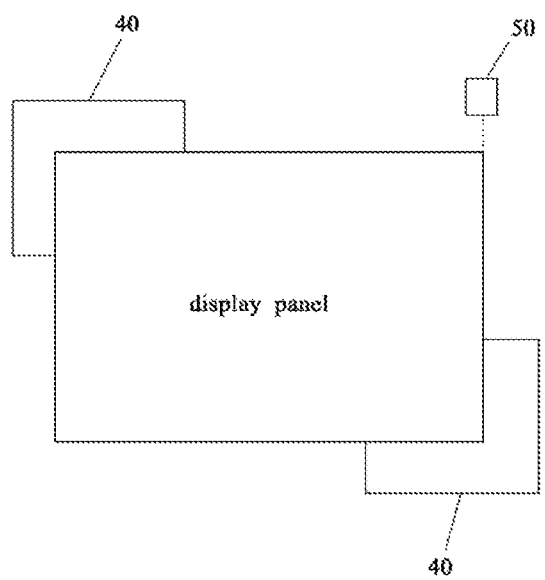
FIG. 5 is a schematic view showing a state where a display panel is fixed by a pair of fixed mechanism and a location of the display panel is tested by a testing mechanism.

Specifically, as shown in FIG. 5, the plug device may further comprise a fixed mechanism 40 for fixing the display panel at the plug location. Such design may prevent the display panel from vibrating after being transmitted to the plug location and fix the location of the display panel, so that the connector 2 may be plugged on pins of the display panel precisely when being plugged on the display panel.

As shown in FIG. 5, the plug device may further comprise a testing mechanism 50 for testing a location where the display panel is located. After the display panel transmitted to the plug location is tested by the testing mechanism 50, the first linkage 1 starts approaching toward the plug location and executing a processing step of plugging the connector 2 on the display panel.

As shown in FIG. 3, the plug device may further comprise a plug interface sensing mechanism 60 which is mounted on the movable end 11 of the first linkage 1 for sensing the plug interface of the display panel plugged with the first connector head 20, as well as a depth of the first connector head 20 plugging into the plug interface. Such design may allow the plug device to precisely recognize whether a location of the plug interface of the display panel plugged with the first connector head 20 is at a correct to-be-plugged location when the first linkage 1 approaches the plug location. If the position between the plug interface of the display panel and the first connector head 20 has a deviation, a feedback signal is provided for the drive mechanism 30 or control unit to re-adjust the position between the plug interface of the display panel and the first connector head 20, until the plug interface of the display panel and the first connector head 20 are at the correct to-be-plugged locations. During the plugging process, the plug interface sensing mechanism 60 senses a depth of the first connector head 20 plugging into the plug interface, so as to prevent the first linkage 1 from moving excessively along a clockwise direction, and further prevent a connection between the first connector head 20 and the plug interface of the display panel from being damaging due to the excessive movement of the first linkage 1.

The plug device according to the embodiment of the disclosure, when the movable end 11 of the first linkage 1 approaches toward the display panel at the plug location, the first connector head 20 of the connector 2 fixed on the movable end 11 also approaches toward the display panel at the plug location, and, during this process, the first connector head 20 contacts a corresponding part (the pins of the display panel that are connected with the connector) of the display panel and is plugged with pins on the display panel, thereby realizing automatic plug of the display panel with the connector 2. That is, during Aging Test (and other tests) of the display panel, when a drive signal is required to be provided for the display panel, a tester only needs to approach the movable end 11 of the first linkage 1 toward the display panel at the plug location, instead of manually plugging the connector 2 with the display panel, to realize plug of the display panel with the connector 2. Compared with manual plug of the prior art, automatic plug may reduce the number of testers desired on the assembly line as well as their labour intensity. Meanwhile, on the other hand, compared with manual plug, automatic plug has higher plug speed and accuracy, thus may improve testing efficiency and accuracy.

According to another aspect of the disclosure, there is also provided a method of utilizing said plug device to automatically plug a display panel with a connector. In this embodiment, the method comprises:

moving the display panel to a plug location; and approaching a movable end of a first linkage toward the plug location so that the connector on the first linkage is automatically plugged with the display panel.

Specifically, a drive mechanism may be used to drive the first linkage to move toward the plug location, or a manual manner may be adopted to move the display panel toward the plug location.

Preferably, after moving the display panel to the plug location, fixing the display panel at the plug location with a fixed mechanism. Such design may prevent the display panel from vibrating after being transmitted to the plug location and fix the location of the display panel, so that the connector and the display panel may be plugged together precisely.

Further, after moving the display panel, testing whether the display panel is at the plug location with a testing mechanism. After the display panel at the plug location is tested, starting moving the first linkage to make the movable end thereof move toward the plug location.

Further, when the movable end of the first linkage approaches the display panel, using a plug interface sensing mechanism to sense a plug interface of the display panel to be plugged with the first connector head, so that the first connector head of the connector is aligned with the plug interface of the display panel, and a depth of the first connector head plugging into the plug interface. Such design may allow the plug device to precisely recognize whether a location of the plug interface of the display panel plugged with the first connector head is at a correct to-be-plugged location when the first linkage approaches the plug location. If the position between the plug interface of the display panel and the first connector head has a deviation, a feedback signal is provided for the drive mechanism or control unit to re-adjust the position between the plug interface of the display panel and the first connector head, until the plug interface of the display panel and the first connector head are at the correct to-be-plugged locations. During the plugging process, the plug interface sensing mechanism senses a depth of the first connector head plugging into the plug interface, so as to prevent the first linkage from moving excessively along a clockwise direction, and further prevent a connection between the first connector head and the plug interface of the display panel from being damaging due to excessive movement of the first linkage.

The method of automatically plugging the display panel with the connector according to the disclosure adopts the plug device provided by the above embodiments of the disclosure to realize automatic plug of the connector with the display panel, the advantages of which lie in that: it can reduce the number of testers desired on the assembly line as well as their labour intensity; meanwhile, it has higher plug speed and accuracy, thus may improve testing efficiency and accuracy.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A plug device for automatically plugging a display panel with a connector comprising:
    a first linkage having a fixed end and a movable end that can approach or get away from the display panel at a plug location,
    wherein the connector comprises a first connector head, a second connector head and a wire that connects the first and second connector heads, the connector is mounted on the first linkage, the first and second connector heads of the connector are respectively secured on the movable end and the fixed end of the first linkage; and
    wherein the second connector head is connected with a signal generator, when the movable end approaches the display panel at the plug location, the first connector head is automatically plugged on the display panel.

2. The plug device according to claim 1, further comprising a fixed part and a second linkage,
    wherein the fixed end of the first linkage is hinged on the fixed part, so that the first linkage can rotate relative to the fixed part with the fixed end thereof as a rotational shaft; and
    wherein both ends of the second linkage are respectively hinged with the fixed part and the first linkage, a hinge shaft between the second linkage and the first linkage is positioned within a sliding groove under the first linkage.

3. The plug device according to claim 1, further comprising a drive mechanism,
    wherein the drive mechanism is used to drive the movable end of the first linkage so that the movable end approaches or gets away from the display panel at the plug location.

4. The plug device according to claim 2, further comprising a drive mechanism,
    wherein the drive mechanism is used to drive the movable end of the first linkage so that the movable end approaches or gets away from the display panel at the plug location.

5. The plug device according to claim 1,
    wherein the connection between the first connector head and the wire is a movable plug and the connection between the second connector head and the wire is a fixed connection.

6. The plug device according to claim 5,
    wherein an end of the wire which is connected with the first connector head is an ox horn socket structure.

7. The plug device according to claim 1,
    wherein a length of pins of the first connector head to be plugged with the display panel is greater than a length of pins of the second connector head to be connected with the signal generator.

8. The plug device according to claim 7,
    wherein the length of pins of the first connector head to be plugged with the display panel is 30-40 mm.

9. The plug device according to claim 1,
    wherein an end of the wire which is connected with the first connector head is a hard material.

10. The plug device according to claim 8,
    wherein an end of the wire which is connected with the first connector head is a hard material.

11. The plug device according to claim 1, further comprising a fixed mechanism,
    wherein the fixed mechanism fixes the display panel at the plug location.

12. The plug device according to claim 1, further comprising a testing mechanism,
    wherein the testing mechanism tests a location where the display panel is located.

13. The plug device according to claim 11, further comprising a testing mechanism,
    wherein the testing mechanism tests a location where the display panel is located.

14. The plug device according to claim 1, further comprising a plug interface sensing mechanism,
    wherein the plug interface sensing mechanism is mounted on the movable end of the first linkage for sensing the plug interface of the display panel plugged with the first connector head, as well as a depth of the first connector head plugging into the plug interface.

15. The plug device according to claim 12, further comprising a plug interface sensing mechanism,
    wherein the plug interface sensing mechanism is mounted on the movable end of the first linkage for sensing the plug interface of the display panel plugged with the first connector head, as well as a depth of the first connector head plugging into the plug interface.

16. The plug device according to claim 13, further comprising a plug interface sensing mechanism,
    wherein the plug interface sensing mechanism is mounted on the movable end of the first linkage for sensing the plug interface of the display panel plugged with the first connector head, as well as a depth of the first connector head plugging into the plug interface.

17. A method of utilizing the plug device according to claim 1 to automatically plug a display panel with a connector comprising:
    moving the display panel to a plug location; and
    approaching a movable end of a first linkage toward the display panel so that the connector on the first linkage is automatically plugged with the display panel.

18. The method according to claim 17,
    wherein after moving the display panel to the plug location, fixing the display panel at the plug location with a fixed mechanism.

19. The method according to claim 17,
    wherein after moving the display panel, testing whether the display panel is at the plug location with a testing mechanism.

20. The method according to claim 17,
    wherein when the movable end of the first linkage approaches the display panel, using a plug interface sensing mechanism to sense a plug interface of the display panel to be plugged with the first connector head, so that the first connector head of the connector is aligned with the plug interface of the display panel, and a depth of the first connector head plugging into the plug interface.

* * * * *